United States Patent
Backhausen et al.

(10) Patent No.: US 8,533,566 B2
(45) Date of Patent: Sep. 10, 2013

(54) METHOD AND APPARATUS FOR STORING DATA

(75) Inventors: Ulrich Backhausen, Taufkirchen (DE); Michael Goessel, Mahlow (DE); Thomas Kern, Munich (DE); Thomas Rabenalt, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 261 days.

(21) Appl. No.: 13/020,318

(22) Filed: Feb. 3, 2011

(65) Prior Publication Data

US 2011/0191658 A1   Aug. 4, 2011

(30) Foreign Application Priority Data

Feb. 4, 2010 (DE) .................... 10 2010 006 876

(51) Int. Cl.
   *G11C 29/00* (2006.01)
(52) U.S. Cl.
   USPC ............... 714/763; 714/780; 714/794

(58) Field of Classification Search
   USPC .................. 714/763, 780, 794, 799, 795
   See application file for complete search history.

(56) References Cited

U.S. PATENT DOCUMENTS

| | | | | |
|---|---|---|---|---|
| 5,689,612 A * | 11/1997 | Abe | ................. | 386/328 |
| 7,362,864 B2 * | 4/2008 | Kryzak et al. | ................. | 380/268 |
| 7,724,903 B1 * | 5/2010 | Kryzak et al. | ................. | 380/265 |
| 7,904,793 B2 * | 3/2011 | Mokhlesi et al. | ............. | 714/780 |
| 8,301,979 B2 * | 10/2012 | Sharon et al. | ................. | 714/763 |
| 2010/0011275 A1 | 1/2010 | Yang | | |

\* cited by examiner

*Primary Examiner* — Fritz Alphonse
(74) *Attorney, Agent, or Firm* — Eschweiler & Associates, LLC

(57) ABSTRACT

When coding user data, it may be desirable to mark user data as invalid. This may arise, by way of example, in applications in which a stored data item needs to be updated by virtue of an updated data item additionally being stored and the old stored data item being marked as invalid. In order to mark the invalidity of a stored data item by means of the value of the data item and to be able to apply an error-recognizing or error-correcting coding dependably, the user data are extended by supplementary data and the coding is applied to the extended user data.

17 Claims, 7 Drawing Sheets

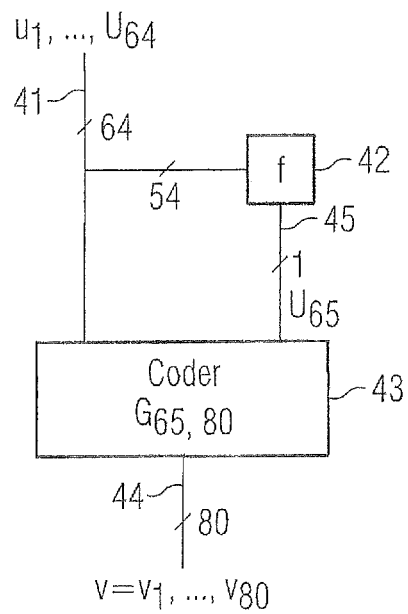
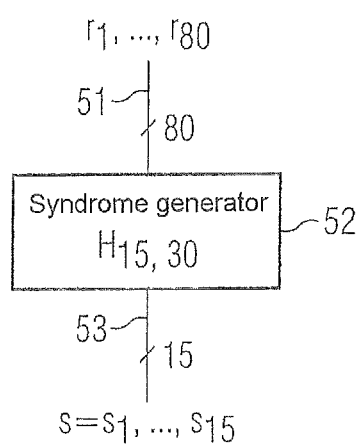

| all-$0_{64}$ | all-$1_{64}$ | Z | $U_{65}$ |
|---|---|---|---|
| 1 | 0 | 1 | 0 |
| 1 | 0 | 0 | 0 |
| 0 | 1 | 1 | 1 |
| 0 | 1 | 0 | 1 |
| 0 | 0 | 1 | 1 |
| 0 | 0 | 0 | 0 |
| 1 | 1 | 1 | ---* |
| 1 | 1 | 0 | ---* |

METHOD AND APPARATUS FOR STORING DATA

FIELD

The present invention relates to a method and an apparatus for storing data.

BACKGROUND

Non-volatile memories (flash memories) as a single/standalone chip or integrated together with logic follow the trend of very large scale integration in the same way as logic chips, for example. To accompany smaller structure widths, the increasing complexity of systems and the increase in volumes of data to be stored in the case of flash memories result in appreciably greater memory requirements in order to be able to usefully control these applications. In contrast to "classic" EEPROM memories, flash memories are distinguished by a smaller cell area, so that flash memories are used for most applications (particularly including data memories). However, one drawback of flash memory is relatively low erasure granularity. By way of example, for most flash memories the smallest erasable unit is a sector (typically larger than 1 kB).

The increasing miniaturization means that it is possible to produce more and more memory cells in the same chip area, increasing interference influences, which can affect the reliability of the memory cells for operations such as programming, erasure and reading. Many of these undesirable effects generally arise only statistically and/or stochastically, however. For this reason, error-correction and error-recognition methods are used in order to ensure that the memory operates properly under these influences. In this case, the methods used are oriented to the quality scale of the respective application (for use in cars, for example, the highest quality scales apply) and the effect and scope of the interference influences.

For the flash memories considered in particular in this case, the general nature is not restricted in considering a shortened BCH code with additional overall parity which is designed for 1-bit and 2-bit error correction and 3-bit error recognition which has a minimum code spacing of 6 and a user data area of 64 bits. In order to take account of the overall parity, the BCH code is extended by the parity, as is known to a person skilled in the art and described in MacWilliams, F., and Sloan, A., "The Theory of Error-Correcting Codes", Amsterdam, 1977, pp. 27 ff., for example. In this case, memories having at least approximately 16 user data bits are of interest in practice, since for smaller numbers of user data bits the number of check bits required is relatively large. The error correction for 1-bit and 2-bit errors and the error recognition for 3-bit errors by means of BCH codes with additional overall parity and a code spacing 6 are known to a person skilled in the art and described in U.S. Pat. No. 4,030,067, for example. So as also to take account of the overall parity, the H matrix of the BCH code which corrects 1-bit and 2-bit errors has a further check bit added to it which provides the overall parity. In U.S. Pat. No. 4,030,067, the H matrix of the BCH code in this case has a row added thereto which contains nothing but ones.

For a user data area of 64 bits, considered as an example, a total of 15 check bits are then obtained, 14 check bits being attributable to the original BCH code and the 15th bit expressing the overall parity. In that case, the overall code word has a length of 64+15=79 bits and is programmed into the memory. The low erasure depth for flash memories now means that it frequently arises that data of a particular type, e.g. the state of an odometer repeatedly, are stored at different times before an erasure operation takes place. These data are then repeatedly present in the memory with, in some cases, data which are already older and already no longer up to date. For the purpose of explicitly identifying older data which are no longer valid as irrelevant or invalid, what is known as an invalidation marker is used. In this context, this marker can be chosen such that in the present example all 79 bits of a data item which is to be marked as invalid, i.e. the user data bits and the check bits of the data item, are programmed or overwritten with 1. The resulting word marked as invalid therefore has a 1 in all of its bits.

One disadvantage in this case is the possibility of the altered code word coming into conflict with the error-recognition or error-correction code used and hampering or preventing error recognition or error correction.

SUMMARY

The present invention is directed to providing a method and an apparatus for coding using an error recognition code which avoid the disadvantages known from the prior art.

In accordance with one embodiment, the user data are extended such that when the coding is applied, a word having a special value which is used for identification as an invalid data item or invalidation is a valid code word based on the applied coding. The effect which can be achieved by this is that the special value for the code word can be used to invalidate a data item and, when the code word is read, the applied coding accepts the code word.

The recognition that a useful word or a code word produced therefrom is invalid can therefore be performed during the decoding or by the decoding device. The extension can be used to reduce or avoid the situations in which, given a prescribed length of the user data, a prescribed coding method and a prescribed special value for identifying invalid data, the special value is not a valid code word and therefore difficulties arise during the decoding.

The special value resulting from coding can, in principle, assume any value but will usually be the All-1 vector for non-volatile memories, since the individual bits can be programmed from 0 to 1 using a write operation, so that a written data item can always be converted to the All-1 vector by means of a write operation regardless of the value.

The invalidation can be effected in different ways. Firstly, provision may be made for a particular value to be reserved in the range of values for the user data and to be used for identifying an invalid data item. So long as the data item is valid, care must be taken to ensure that the reserved value does not arise. As soon as a data item needs to be invalidated, it is overwritten with the reserved value. The reserved value for the user data or the useful word can be chosen, in particular, such that the code word produced therefrom on the basis of coding is the All-1 vector. In this case, the supplementary data can be produced on the basis of the user data such that when the reserved value for the user data appears, the supplementary data are produced such that a code word produced from user data and supplementary data assumes the desired special value and particularly the All-1 vector. The supplementary data, which may also be just a single bit, can be produced using a combinatoric unit or a combinational logic circuit which logically combines the user data and produces the supplementary data therefrom.

In this case, the supplementary data can be produced such that they are exclusively dependent on the user data or are produced exclusively from the user data only if they are required for producing the special value for the code word. This is the case, for example, when the user data assume the reserved value. If the supplementary data are not required for this purpose or if the value of the user data does not assume the reserved value then the supplementary data can be used for other purposes.

In another embodiment, the invalidation is brought about by setting the code word directly to the special value, for example by virtue of the coding device producing a code word with the special value upon an invalidation command, for example, regardless of the user data supplied. Furthermore, it is also possible for a device arranged downstream of the coding device to alter the code word produced by the coding device, before it is written to the memory, such that it assumes the special value. In this case, the full range of values of the user data can be used for valid values, since the invalidation is not triggered by the value of the user data themselves. However, it is possible that, for a particular combination of user data and supplementary data, the properly produced code word assumes the special value even without invalidation having been intended. To avoid the situation, it must be ensured that the supplementary data never combine with the user data to produce the special value as a code word without invalidation being intended. To this end, provision may be made for the supplementary data to be produced on the basis of the user data such that the user data and the supplementary data allow the coding device exclusively to produce code words with a value which is different from the special value or all special values.

In all cases, additional memory space is available with the supplementary data, said memory space being able to be provided for a user or being able to be used for storing system data.

In accordance with one embodiment, user data containing useful data bits are coded into code words using an error recognition code, the code words being produced on the basis of the user data and at least one supplementary bit. The at least one supplementary bit is produced by means of a combinatorial function on the basis of the user data and a supplementary information item.

One embodiment involves a circuit arrangement for coding and for the error correction of 1-bit and 2-bit errors and for the error recognition of 3-bit errors for K user data bits which are to be checked $u_1, u_2, \ldots, u_K$, where $K \geq 16$ and m check bits $c_1, c_2, \ldots, c_m$, where $m \geq 13$, using a shortened BCH code with included overall parity which has the length K+m+1, which has been determined by shortening from an unshortened BCH code with included overall parity with a $(2^n-1-m, 2^n-1)$ generator matrix G and an $(m, 2^n-1)$ H matrix H and which has a code spacing 6, wherein the unshortened BCH code has the length $2^n-1$, where $2^n-1>K+m+1$, K being an even number and the circuit arrangement containing at least one coder and a syndrome generator as subcircuits, having the following features:

a) the coder has K first inputs, to which the K binary values of the user data bits $u_1, u_2, \ldots, u_K$ are applied, and a further 1-bit input, to which an additional (K+1)th bit $u_{K+1}$ is applied, wherein the value of this additional bit $u_{K+1}$ is determined such that $u_{K+1}=0$ is true at least when $u_1=u_2=\ldots=u_K=0$ and that $u_{K+1}=1$ is true at least when $u_1=u_2=\ldots=u_K=1$ is true, b) the coder is implemented such that the code words of the shortened code are formed functionally on the basis of the relationship $$v_1, \ldots, v_{K+m+1} = (u_1, \ldots, u_K, u_{K+1}) \cdot G_{short}$$

where $G_{short}$ is the (K+1, K+1+m) G matrix of the shortened BCH code with included overall parity, c) the subcircuit for syndrome formation implements an H matrix $H_{short} = (h1, \ldots, h_{K+m+1})$ of the shortened code, which is an (m, K+1+m) matrix, wherein the columns $h_0, \ldots, h_{K+1+m}$ of the H matrix $H_{short}$ are such a subset of the columns of the H matrix H of the unshortened code so that $$\sum_{i=1}^{K+m+1} h_i = 0$$

is true and wherein the sum of the column vectors $h_i$ is implemented on a component-by-component basis in modulo 2 form.

In one development, $K=2^k$, where $k \geq 4$.

In one embodiment, the additional bit $u_{K+1}$ is determined such that $$u_{K+1} \begin{cases} 0 & \text{for } u_1 = u_2 = \ldots = u_K = 0 \\ 1 & \text{otherwise} \end{cases}$$

is true.

In one embodiment, the circuit for coding and for the error correction of 1-bit and 2-bit errors and for the recognition of 3-bit errors is used for correcting errors and for recognizing errors in a memory.

In one embodiment, the memory is a flash memory.

In one embodiment, the additional $bit_{K+1}$ is determined such that $$u_{K+1} \begin{cases} 0 & \text{for } u_1 = u_2 = \ldots = u_K = 1 \\ 1 & \text{otherwise} \end{cases}$$

is true.

In one embodiment, additional bits $u_{K+1}=u_i$ and i are one of the values $1, \ldots, K$.

In one embodiment, the value of the additional bit $u_{K+1}$ is used for storing an additional binary information item if not all the user data bits $u_1, u_2, \ldots, u_K$ are equal to 0 or all the user data bits $u_1, u_2, \ldots, u_K$ are equal to 1.

In one embodiment, the value of the additional bit $u_{K+1}$ is used for indicating whether a block of a memory or memory area has been erased correctly or has not been erased correctly.

In one embodiment, the value of the additional bit $u_{K+1}$ is used for indicating whether a block of a memory or memory area initially put into the erased state has been written to correctly or has not been written to correctly.

In one embodiment, the value of the additional bit $u_{K+1}$ is used for storing the value of a component of a counter reading. The counter reading may indicate the number of erase cycles for a flash memory. The counter reading may indicate the number of write cycles for a flash memory. The counter reading may also indicate the odometer reading for a vehicle.

In one embodiment, the additional bit $u_{K+1}$ is used for storing a status information item for a flash memory.

In addition, the additional bit $u_{K+1}$ can be used for storing a component of a voltage setting, a component of a control setting or a key.

The value of the additional bit $u_{K+1}$ may be invertible for test purposes.

The term error recognition or error-recognizing or error correction or error-correcting is used synonymously with error recognition and/or error correction or error-recognizing and/or error-correcting, since error correction always also includes error recognition.

An altered word which has been marked as invalid, for example, and has a 1 in all bits and is also called an All-1 vector has to be a valid code word if the memory is protected against errors by an error-correcting code.

With a code length of n=79, however, it is not possible for a word having exclusively programmed (to 1) bits to be a valid code word of a 2-bit error-correcting and 3-bit error-recognizing BCH code, which is disadvantageous. It is also not possible to recode the All-1 vector to zeros, since in the case of flash memories this code word already has an assignment as a result of the state following erasure. If all the bits in a word are 0, the All-0 vector is also referred to.

Both vectors, All-1 and All-0, must therefore be valid code vectors. A person skilled in the art is aware that $v=v_i, \ldots, v$, is the code word of a linear code with an H matrix H precisely when the syndrome associated with the vector v $$s = H \cdot v^T$$

is equal to Q. The H matrix is also called a check matrix. In this case, the matrix H $$H = (h_1, \ldots, h_n)$$

is an (m, n) matrix comprising n different m-dimensional column vectors $h_1, \ldots, h_n$ when the linear code has m check bits and the length m. denotes the m-dimensional column vector, the components of which are all 0. The syndrome s is an m-dimensional vector and $v^T$ is the transposed vector of the row vector v, i.e. the corresponding column vector.

Linear codes are known to a person skilled in the art. Furthermore, an introductory illustration is provided in MacWilliams, F. and Sloan, N., The Theory of Error Correcting Codes, Amsterdam, 1977, for example, with particular reference being made to chapter 1. It can be seen that the n-dimensional vector $$\underline{1 = 1, 1, \ldots, 1}_{n},$$

which is also called an All-1 vector, cannot be a valid code vector if n is an uneven number, as is the case for n=79. If the H-matrix is multiplied by the transposed All-1 vector, the syndrome s is determined to be $$s = H \cdot (1, \ldots, 1)^T = h_1 + h_2 + \ldots + h_n,$$

where "+" in this case signifies the component-by-component addition in the Galois field GF(2), i.e. the component-by-component modulo 2 addition of the m-dimensional column vectors $h_1, \ldots, h_n$. Since the row of the H matrix which corresponds to the overall parity contains n=79 ones, that component of the syndrome which corresponds to this row is equal to 1, since n is an uneven number. The syndrome is therefore not equal to 0, and the All-1 vector cannot be a code vector if n is uneven.

This requires the code to be extended by at least one additional bit, which will now be described. In this case, the value of this additional bit is first of all stipulated only by the conditions that the All-1 vector and the All-0 vector are meant to be code vectors. The additional bit must therefore assume the value 1 when all the user data bits are equal to 1, and it must assume the value 0 when all the user data bits are equal to 0.

If the All-1 vector is the code vector of the code under consideration, the check bits $c_1, \ldots, c_{15}$ are determined to be 1, . . . , 1 when the user data bits $u_i, \ldots, u_{64}$ and the additional bits $u_{65}$ are each equal to 1, since the association between the values of the bits $u_1, \ldots, u_{64}, u_{65}$ and the check bits $c_1, \ldots, c_{15}$ is explicit.

In the case of 64 user data bits, there are 264 different possible assignments for these bits. In this case, as explained, the additional bit is first of all stipulated only for two of these assignments and is otherwise freely selectable. This now surprisingly allows advantageous use of this additional bit, in particular for flash memories.

In flash memories, the write unit and the read unit usually have different sizes, since the physical writing to a flash memory usually requires a longer time than the reading. The data to be written are therefore first collected in a page and then written to the memory in a programming step, as a person skilled in the art knows.

FIG. 11 outlines the basic design of a page 111, i.e. a write unit. The write unit usually comprises a plurality of blocks, in FIG. 11 the 8 blocks $Block_1$, 1111, . . . , $Block_8$ 1118, which each represent a read unit.

In FIG. 11, each block $Block_i$ comprises 64 user data bits $(u_i, \ldots, u_{64})^i$, an additional bit $u_{65}^i$ and 15 check bits $(c_1, \ldots, c_{15})^i$. In this example, the page comprises 8 blocks, which in total results in 8 additional bits per page, to which it is possible to write various information relevant to the application.

The following options are described as an example:

For data storage applications, it is often desirable to indicate successful programming (writing) and/or erasure by means of a success marker, for example. This is necessary particularly in those cases in which a programming operation on the flash memory is terminated by a reset, e.g. as the result of a dip in the power supply. This can result in states in which the memory cell content has been written or erased only inadequately. To prevent this, a marker is set following the successful execution of a programming operation or erasure operation. If this marker is missing, it is then indicated to the system that the memory content associated with said marker has not been correctly written or erased. For programming, for example, such a marker with the value 1 can be written to the additional bit, so that the All-1 vector remains a valid code vector, for example.

A further advantageous use of the additional bit is storage of the number of programming or erase cycles. Data memories are known not to be able to be rewritten as often as desired on account of the electrical stress in the cells and are therefore subject to a maximum number of write/erase cycles (endurance). To ensure and make it possible to check that this limit is observed, the number of write/erase cycles can be stored in the area of the additional bits. This information can then be used, by way of example, to set internal voltages in a flash memory and programming times on the basis of the counter reading stored in the additional bits, for example in order to compensate for ageing effects in the cells.

For safety-critical applications, it is often required that the addresses associated with the data item, for example the word line address, be integrated into the word which is to be written, in order to be able to check the integrity of the addresses. The addresses associated with a data item can likewise be written to the additional bits. During reading, it is then a simple matter to check the correctness of the applied address. A further safety-critical application is the storage of a key information item for enciphering and deciphering safety-critical data.

By way of example, it is likewise possible to store a control or status register content, such as voltage settings or control settings or the chip temperature, in the additional bits.

In this case, it is merely necessary to ensure that the additional bit $u_{K+1}$ is equal to 1 when all K user data bits are equal to 1, and is 0 when all the user data bits are equal to 0. This is not a significant restriction for the previously described functions, since the programming of All-1 firstly occurs very rarely, for example. The presented application examples are naturally not conclusive, since the additional bits of the blocks (e.g. as FIG. 11 shows, there are 8 additional bits for 8 blocks) for a page can store practically any information which is useful for the operation or application of the chip.

The applications described above therefore work advantageously because an entire page is always programmed in a flash memory per programming pulse, said page comprising Mx64 data blocks, or comprising Mx80 data blocks, when the error correction of 2-bit errors and the error recognition of 3-bit errors is included. Although the example described contains only one additional bit per 80 bits, it is possible for up to M bits to be additionally stored during a programming operation.

DESCRIPTION OF THE DRAWINGS

The invention will be explained below with reference to exemplary embodiments. In this context, FIG. 4 shows the block diagram of a coder with 64 user data bits and an additional 65$^{th}$ bit, FIG. 5 shows the block diagram of a syndrome generator.

DETAILED DESCRIPTION

Figure 1:
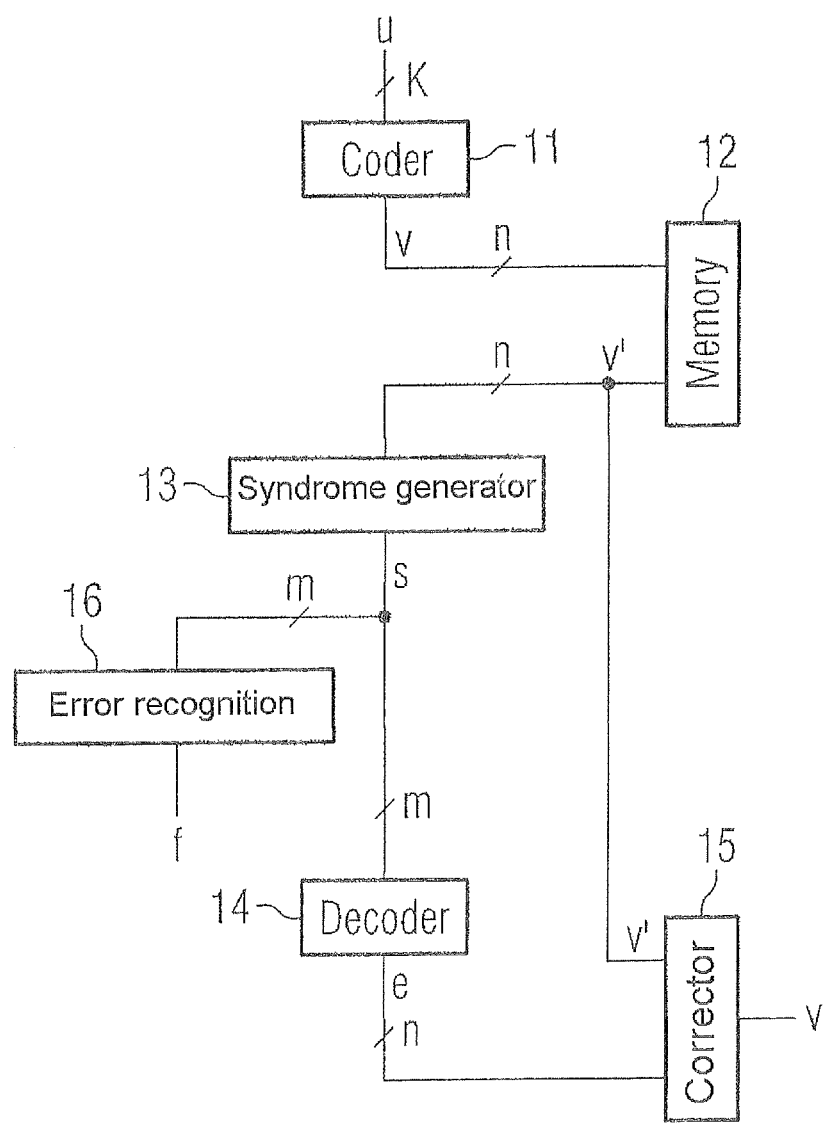
FIG. 1 shows the block diagram of a circuit for error correction and error recognition based on the prior art.

Since a person skilled in the art is familiar with the structure of an error-correcting and error-recognizing BCH code, which are furthermore presented in textbooks about coding theory such as McWilliam, F. and Sloane, N. "The Theory of Error Correcting Codes", North Holland, Amsterdam, 1977, only those which are fundamental to the invention are discussed briefly at this juncture. The most important concepts of coding theory which are used to describe the invention will be described briefly too. Thus, in one embodiment the invention uses a binary shortened BCH code with included overall parity for 1-bit and 2-bit error correction and for 3-bit error recognition with a minimum code spacing 6. This is a special linear code which, like any linear code, can be described by a generator matrix G and an H matrix H.

The length of the code is denoted by n, the number of check bits is denoted by m and the number of information bits or data bits is denoted by k. In this case, k=n−m is true. The G matrix G is then a (k,n) matrix having k rows and n columns, and the H matrix H is an (m,n) matrix having m rows and n columns.

In its systematic form, the following is true for the generator matrix:

$$G(P_{k,m}, I_k) \quad (1)$$

where $I_K$ is the K-dimensional unit matrix and the (K,m) matrix $P_{K,m}$ can be called a parity matrix. It is noted that in this case the check bits are appended to the left of the information bits. Similarly, it is possible for the check bits to be appended to the right of the information bits. (However in this case, the G matrix would have the form $G=(I_K, P_{K,m})$).

In its systematic form, the H matrix associated with the G matrix presented in equation (1) is $$H = (I_m, P_{m,K}^T) \quad (2)$$

$P_{m,K}^T$ is the transposed matrix for the matrix $P_{K,m}$ and $I_m$ is the m-dimensional unit matrix. The K rows of the G matrix form a basis for a K-dimensional vector space, the elements of which are the code words of the code under consideration. From the K-information bits of the code $u=u_1, \ldots, u_K$, the n bits of the associated code word $v=v_1, \ldots, v_n$, are determined to be $$v_1 \ldots, v_n := (u_1, \ldots, u_k) \cdot G \quad (3)$$

The rows of the H matrix form a basis for the corresponding orthogonal vector space. Besides the systematic form of the matrices G and H, non-systematic representations of these matrices are also known which are described, by way of example, in Lin, S, Costello, D. Error Control Coding, Fundamentals and Applications, Prentice Hall, 1987, and MacWilliams, F., and Sloan, A., The Theory of Error Correcting Codes, Amsterdam, 1977. The matrix H is used to check whether or not an n-dimensional vector $r=r_1, \ldots, r_1$ is a code vector for the code under consideration. The following is true:

$$s = H \cdot r^T = r \cdot H^T, \quad (4)$$

where s is an m-dimensional vector which is called the syndrome of r. The syndrome s is equal to 0 precisely when r is the code vector. If r differs from a code vector v by an error vector e then $$s = H \cdot r^T = H \cdot (v^T + e^T) = H \cdot e^T. \quad (5)$$

If the error vector is equal to the 0 vector then r=v and a code vector is present. In the event of i-bit error, precisely i components of the error vector e are equal to 1 and all other components are equal to 0.

FIG. 1 shows the block diagram of a circuit for error correction and error recognition based on the prior art. The applied K-bit data u are coded into an n-bit code word v in a coder 11, which is determined by the G matrix of the code under consideration, and written in encoded form into a memory 12. When the data are read, the encoded data are processed in a syndrome generator 13, which is determined by the H matrix of the code under consideration, to form an m-bit syndrome s. The read data are denoted by v' in order to express that errors can arise when the data are stored in the memory or when said data are kept in the memory, and therefore v is not necessarily equal to v'. Generally, v' v+e, is true, with the n-component vector $e=e_1, \ldots, e_n$ being called an error vector. If e=0 then there is no error.

The output of the syndrome generator 13, which carries the m-bit error syndrome s, is simultaneously connected to the m-bit input of a decoder 14 and to the m-bit input of an error recognition circuit 16. The decoder 14 takes the applied error syndrome s and generates the n-bit error vector e, which is XORed in the corrector 15 on a component-by-component basis with the components of v' which are read from the memory 12. XORing is identified by the symbol "+". In FIG. 1, the error recognition circuit 16 is a combinatorial circuit which takes the error syndrome s and determines whether there are 1-bit, 2-bit, . . . errors.

Figure 2:
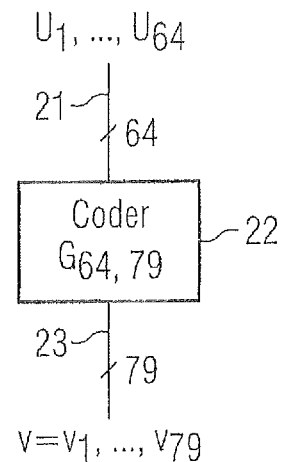
FIG. 2 shows the block diagram of a coder for a linear code based on the prior art.

FIG. 2 illustrates how the prior art assumes the coding of k data bits $u=u_1, \ldots, u_K$, The word lengths correspond to the coding of an information word with a 64-bit useful length into a code word containing 79 bits, as is the case for a shortened BCH code with included overall parity and a code spacing of 6. The 64-bit input lines 21 carrying the word $u=u_1, \ldots, u_{64}$ which is to be coded are connected to the 64-bit input of the coder 22, the 79 output lines 23 of which carry the associated code word $v_{79}$. The coder 22 uses XOR trees to implement a relationship as shown in equation (3).

Figure 3:
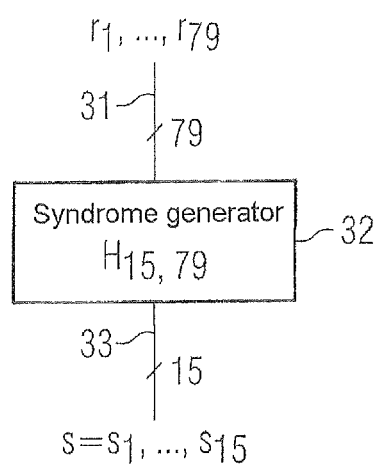
FIG. 3 shows the block diagram of a syndrome generator for a linear code based on the prior art.

FIG. 3 shows a syndrome generator based on the prior art which implements equation (4). It is likewise implemented by means of XOR trees in a manner which is known to a person skilled in the art. The n=79 data lines 31 carrying the 79-bit word r=v+e are connected to the inputs of the syndrome generator 32, which forms the 15-bit syndrome $s=H \cdot r^T$ and outputs it on its 15-bit output lines 33.

The H matrix of the syndrome generator $H_{15,79}$ in FIG. 3 is the 11 matrix of a BCH code shortened to 79 columns which was obtained from an unshortened BCH code having additional overall parity of length 127.
As explained, the vector, of length 79, which comprises only ones, cannot be mapped onto the syndrome 0 by the syndrome generator. It is therefore not a code vector, which is disadvantageous.

The invention will now be explained in more detail using the example with 64 user data bits; it is naturally not limited to 64 user data bits. FIG. 4 illustrates a coder according to the invention for 64 user data bits. As FIG. 4 shows, the K=64 user data bits $u_1, \ldots, u_{64}$, now have a further (K+1)th bit, in this case a sixty-fifth bit $u_{65}$, added to them. The 65th bit $u_{65}$ is derived logically from the 64 user data bits $u_1, \ldots, u_{64}$ by a combinatoric unit 42 which implements the Boolean function $f$ where $$f(\underbrace{0, \ldots, 0}_{64}) = 0, \text{ and } f(\underbrace{1, \ldots, 1}_{64}) = 1. \quad (6)$$

The Boolean function $f$ is partially determined by equation (6). The (K+1)th bit (in this case bit $u_{65}$) is stipulated to be 0 when all the user data bits are equal to 0 and is stipulated to be 1 when all the user data bits are equal to 1. For all other assignments to the user data bits, equation (6) does not stipulate the value of the additional bit and of the function $f$, which means that the unstipulated values can be used to optimize the function $f$ or advantageously to store further information in the additional bit, as explained more precisely later.

Advantageous refinements of the invention arise particularly when the additional bit $u_{k+1}$ is used for storing additional information, which is of interest in flash memories when not all user data bits are equal to 0 and not all user data bits are equal to 1. The 64-bit data lines 41 carrying the user data $u_1, \ldots, u_{64}$ are routed both to the 64 first inputs of the coder 43 and to the inputs of the combinatoric unit for the purpose of implementing the combinatorial function $f$ 42, which forms the additional bit 65 at its output 45. The 1-bit output of the combinatoric unit 42, which carries the additional 65$^{th}$ bit, is connected to the 65$^{th}$ input of the coder. The coder codes the data $u_1, \ldots, u_{65}$ applied to its inputs in accordance with a (65,80) G matrix $G_{65,80}$ in an 80-bit code word $v_1, \ldots, v_{80}$ which is output at its output 44. The G matrix $G_{65,80}$, which can be used in systematic or else non-systematic form, is in this case—in contrast to the G matrix in FIG. 2—a G-matrix for a BCH code shortened to 80 bits with overall parity of original length 127, for which the vector $$\underbrace{1, \ldots, 1}_{80}$$

is also a code vector.

This G-matrix can be determined from the shortened H matrix $H_{15,80}$ using a customary method, for example by converting the H matrix into its systematic form and reading the relevant G matrix directly therefrom, as is known to a person skilled in the art, and as illustrated in the book Lin, S. and Costello, J., Error Control Coding, Fundamentals and Applications, Prentice Hall, 1983, for example.

The determination of the H matrix will now be explained in more detail. In the example shown, to which the invention is naturally not limited, we continue to assume that 65 bits need to be coded, which contain 64 useful bits and an additional sixty-fifth bit. Since there are unshortened BCH codes of length 15, 31, 63, 127, . . . , generally of length $n=2^{k_1}-1$ for $k_1=4, 5, 6, \ldots$, this case requires a length of $127=2^7-1$ for the unshortened BCH code. From this code, the desired code is determined by shortening, i.e. by deleting 47 columns of the 127 columns of the H matrix of the unshortened code. The associated modular polynomial of the BCH code under consideration, which we select as a primitive polynomial for the sake of simplicity, but not necessarily, is of level $k_1=7$. This primitive polynomial $G_1(z)$ of level 7 with the primitive root $\alpha=z$, which is the modular polynomial of the Galois field $GF(2^7)$, can be found by way of example in appendix C of the book Peterson, W. and Weldon, E. Error Correcting Codes, 1IT Press, 2$^{nd}$ Edition, 1972. The following is true:

$$G^1(z)=z^7+z^3+1.$$

The minimum polynomial $G^2(z)$ of root $\alpha^3=z^3$ is taken from the same source. It likewise has the level $k_2=7$. The following is true:

$$G_2(z)=z^7|z^3|z^2|z|1.$$

The number m of check bits is determined by the levels $k_1$ of $G_1$ and $k_2$ of $G_2$ and by the additional bit for checking the overall parity P to be $$m=ki+k2+1=7+7+1=15.$$

The 65 bits which are obtained from the 64-bit user data and the additional sixty-fifth bit, thus need to be protected by 15 check bits in the example under consideration. The length of the shortened BCH code with additional overall parity is 80. An H matrix of the BCH code having additional overall parity can be represented in the separate form as $$H = \begin{pmatrix} H_1 \\ H_3 \\ P \end{pmatrix}.$$

The H matrix $$H = \begin{pmatrix} H_1 \\ H_3 \end{pmatrix}$$

of the BCH code without consideration of the overall parity has a matrix P, which comprises only a single row of nothing but ones, added to it, as is known to a person skilled in the art and as described in U.S. Pat. No. 4,030,067 for example. In this case:

$$H_1 = (\alpha^0 \alpha^1, \ldots, \alpha^{n-1})$$

$$H_3 = ((\alpha^0)^3, (\alpha^1)^3, \ldots (\alpha^{n-1})^3),$$

$$P = \underbrace{(1, 1, \ldots, 1)}_{n}$$

The powers $\alpha^i$ for $i=0, 1, \ldots, 126$, are—since in this case $k_1=7$ is true—presented in the usual manner as a 7-component vector representation of c in the Galois field GF $(2^7)$. In the example under consideration, $n=2^{k1}-1=127$, and the exponents of $\alpha=z$ should accordingly be regarded modulo 127. In order to shorten the unshortened BCH code of length 127 to the length 65+15=80, it is now necessary to delete 47 columns of the 127 columns of the H matrix of the unshortened code, so that the component-by-component XOR sum of the remaining 80 columns gives the 0 vector. Since the number of columns remaining, at 80 columns, is even, the XOR sum of the parity bits of the overall parity in the last row of the shortened H matrix is always equal to zero. The columns to be deleted are most simply determined using a computer program by randomly selecting 47 columns of the H matrix of the unshortened code until the sum of the unselected 80 columns gives the 0 vector.

An example of an H matrix having 80 columns, for which the component-by-component XOR sum of its columns gives the 0 vector, is obtained by deleting from the H matrix of the unshortened code the columns 16, 21, 23, 24, 33, 34, 35, 36, 39, 40, 42, 43, 44, 46, 49, 50, 51, 53, 55, 56, 58, 67, 70, 74, 78, 79, 80, 84, 87, 90, 91, 92, 93, 94, 95, 97, 99, 103, 106, 109, 110, 114, 119, 121, 122, 123, 125, for example, which is most easily seen by directly checking the calculation. The deleted i-th vector has a column which assumes the value $\alpha^{i-1}$ in the matrix $H_1$ and which therefore assumes the value $\alpha^{3(i-1)}$ in the matrix $H_3$.

FIG. 5 shows a syndrome generator for a code of length 80, with 64 user data bits and an additional 65$^{th}$ bit and 15 check bits. The now 80-bit input lines 51 carrying the 80-bit values $r=v+e$ are routed to the syndrome generator 52, the 15-bit output of which outputs the syndrome s. The syndrome generator 52 implements the syndrome formation in line with an H matrix $H_{15,80}$, which is the H matrix—shortened by 47 columns to 80 columns—of a BCH code with included overall parity of length 127 with the code spacing 6, so that the vector $$\underbrace{1, \ldots, 1}_{n}$$

is mapped onto the syndrome 0 and is therefore a code vector.

The 0 vector $$\underbrace{0, \ldots, 0}_{80}$$

is, as in the case of any linear code, a code vector.

Figures 6, 7:
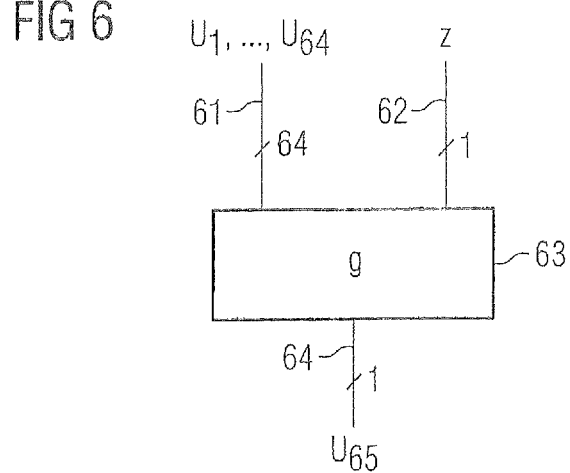
FIG. 6 shows a circuit for use of the additional bit for storing additional information.
FIG. 7 shows a table of values for a function g for determining the value of an additional bit.

FIG. 6 will now be used to explain an example of how the additional bit $u_{K+1}$ can be used in accordance with the invention to store additional information. Again, 64 user data bits $u_1, \ldots, u_{64}$ and an additional bit $u_{65}$ are considered. In FIG. 6, the 64 user data bits and a further 1-bit value z which is to be stored are used to determine the assignment of the additional bit $u_{65}$ by a combinatorial function g. The 64-bit line 61 carrying the user data bits $u_1, \ldots, u_{64}$ is routed to the first 64 inputs of the combinatoric unit 63, which implements the 65-bit Boolean function g, the second 1-bit input of which has the line 62 applied to it, which carries the additional information item z and the 1-bit output 61 of which carries the value of the additional bit $u_{65}$. The combinatoric unit for implementing the function g 63 in FIG. 6 has—in contrast to the combinatoric unit 32 for implementing the function f in FIG. 4—an additional 1-bit input line 62 for inputting an additional information item z. In order to simplify the description as far as possible, all-$0_{64}$=1 (true) denotes that all user data bits $u_1, \ldots, u_{64}$ are equal to 0, and all-$0_{64}$=0 denotes that not all user data bits are equal to 0. Similarly, all-$1_{64}$=1 (true) denotes that all user data bits $u_1, \ldots, u_{64}$ are equal to 1, and all-$1_{64}$=0 denotes that not all user data bits are equal to 1.

Figure 8:
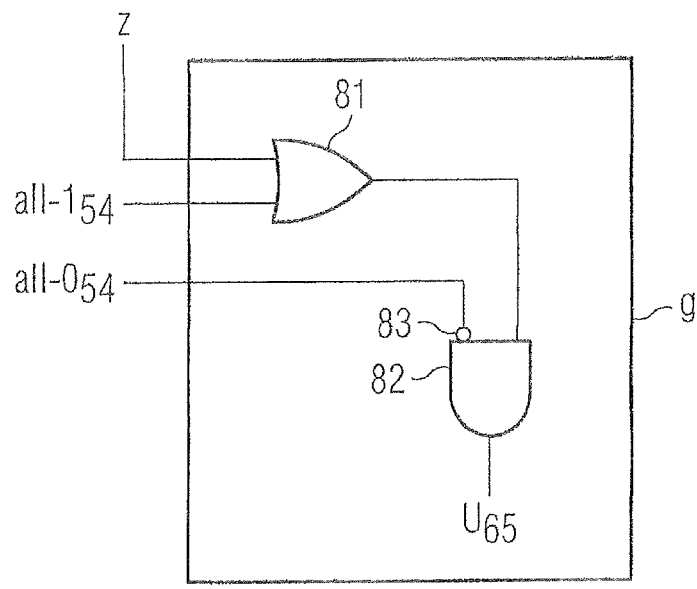
FIG. 8 shows a possible implementation of the Boolean function g from FIG. 7.

FIG. 7 shows the table of values for the Boolean function g. One possible implementation of the function g is $$u_{65}=g(\text{all-1},\text{all-0},z)=\overline{\text{all-0}} \wedge ([\text{all-1}] \vee z), \qquad (7)$$

which is shown in FIG. 8. The 1-bit line carrying the signal all-$1_{64}$ is connected to the first input of an OR gate 81, the second input of which has the line carrying the signal z connected to it. The output of the OR gate 81 is routed to the first input of an AND gate 82, the second input of which has the line carrying the all-$1_{64}$ signal applied to it via a NOT gate 83. The output of the AND gate 82 carries the value of the additional bit $u_{K+1}$, where K+1=65 in this case. If all-$1_{64}$=1, then all-$0_{64}$=0, and the additional bit $u_{K+1}$ has the value 1. If all-$0_{64}$=1, then all-$1_{64}$=0, and the additional bit $u_{K+1}$ has the value 0. If both all-$1_{64}$=0 and all-$0_{64}$=0, then the additional bit $u_{K+1}$ has the value z. This case occurs by far the most often, namely for $2^{64}-2$ assignments from the total of $2^{64}$ assignments of the user data bits $u_1, \ldots, u_{64}$. The case all-$1_{64}$=all-$0_{64}$=1 does not occur.

The text below is intended to illustrate how the additional bit can be used particularly advantageously in the case of flash memories. Surprisingly, particularly beneficial and particularly simple uses for the additional bit $u_{K+1}$ for storing additional information arise in this case, which will now be explained. Overwriting a value 1 (in this case programmed) in a single memory cell with a value 0 (erased) is not possible in a flash memory, and the logic association may also be converse. As has already been explained, flash memories are generally erased by local line or by sector (using multiple word lines) in order to produce the value 0 in them, and this ensures that all cells in the addressed block assume the value 0. As a result, in a flash memory, just the erase operation always guarantees that following the erasure the additional memory cell $u_{K+1}$ of each block of an erased page assumes the value 0 when $u_1=u_2=\ldots=u_K=0$.

In order to store an additional information item z in a flash memory in the additional bit $u_{K+1}$, it is then logically necessary only to ensure that $u_{K+1}$ has 1 written to it when $u_1 = u_2 = \ldots = u_K = 1$ is true. Instead of the function g described in equation (7), it is then possible to implement the simpler function gF1 using $$u_{65} = g_{F1}(\text{all-1}, z) = (\text{all-1}) \vee z, \quad (8)$$

since the property that the value of $u_{K+1}$-$u_{64}$ is always equal to 0 for $u_1 = \ldots u_{64} = 0$ is generally guaranteed just by the erase operation itself in a flash memory. In this case, the value "all-1" can be determined by means of logic, for example, from the values of the user data bits to be $$(\text{all-1}) = u_1 \wedge u_2 \wedge \ldots \wedge u_K.$$

Figure 9:
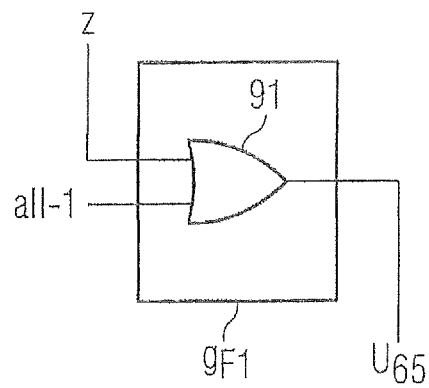
FIG. 9 shows a combinatorial circuit for storing an additional information item in a flash memory.
Figure 10:
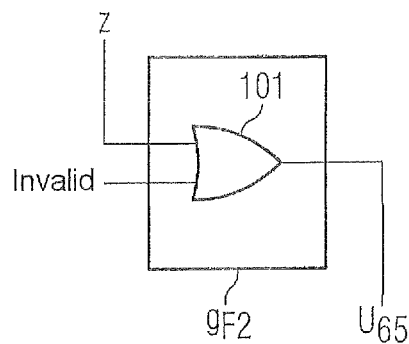
FIG. 10 shows a logic circuit for storing an additional information item in a flash memory with an "invalid" command.

FIG. 9 shows an appropriate circuit arrangement. The 1-bit line which carries the value all-$1_{64}$ is routed to the first input of an OR gate 91, the second input of which has the 1-bit line carrying the information item z connected to it. The 1-bit output line of the OR gate 91 carries the value of the additional bit $u_{85}$. A particularly simple solution is obtained for the case in which the invalidity of a value written to the memory at an address A is marked by virtue of all the bits of the word which are stored at this address being overwritten with 1. In that case, a further simplification is possible. If "all-1" as the value in the intended application is not used as a valid data item and if "invalid [A]" is the name of the command which overwrites the value of all the memory cells at the selected address A with 1, it is possible for the determination of the value of the additional memory cell $u_{K+1}$ by means of the Boolean function 9F2 to be implemented as $$u_{K+1} = gF2(\text{invalid}, z) = (\text{invalid}) \vee z,$$

since for the address A the relationship $u_1 = u_2 = \ldots = u_{64} = 1$ is true whenever the command "invalid[A]" has been applied. If this command is applied, therefore, then the additional memory cell u65 always has 1 written to it. FIG. 10 shows the appropriate circuit. The 1-bit line which carries the value "invalid" is connected to the first input of an OR gate 101, the second input of which has the 1-bit line carrying the information item z connected to it. The output of the OR gate 101 carries the value of the additional bit $u_{K+1} = u_{65}$, and it can be seen that when the command "invalid" is present the additional bit $u_{65}$ is overwritten with 1 and otherwise carries the information item z.

When writing to memory cells in a flash memory, it may arise that the write operation at an address A is interrupted before all the memory cells associated with a word have been written completely. If this is the case then erroneous information has been stored at the address A, since not all of the memory cells associated with said address have been written to. In order to identify such a situation and to avoid the use of incompletely written memory cells, it is possible to use a binary signal "write complete", the value 1 of which indicates that the write operation at an address has actually been concluded, and the value 0 of which means that the write operation has not been terminated properly or that, following erasure, there have still not been any data written to the user data bits if all the user data bits carry the value 0. In such a situation, it is surprisingly possible to simply write the signal "write complete" to the additional bit $u_{K+1}$ on account of the special properties of a flash memory, which means that $$\text{write complete} = u_{K+1}$$

can be set. Specifically, K+1=65 is true in the application example. On account of the properties of a flash memory, the value of the additional (K+1)th bit $u_{k+1} = 0$ when $u_1 = u_2 = \ldots = u_K = 0$ is true, since, as already explained, block-by-block erasure of the flash memory involves all the memory cells, including the memory cell of the block which stores the value $u_{K+1}$, being set to 0. If a word which contains the bits $u_1 = u_2 = \ldots = u_K$ is written successfully, the all-0 assignment of the memory cells is overwritten with values for which at least one value of the user data bits is equal to 1. The signal "write complete" is equal to 1, and $u_{K+1} = 1$ is true, wherein, as explained, the all-0 assignment cannot be present. $u_{K+1}$ is naturally equal to 1 even when u1=...1 has been written successfully. Hence, the condition is also met that $u_{K+1} = 1$ for $u_1 = u_2 = \ldots = u_K = 1$ is true. The line carrying the signal "write complete" is then connected directly to the data input of the memory cell $u_{K+1}$.

Figure 11:
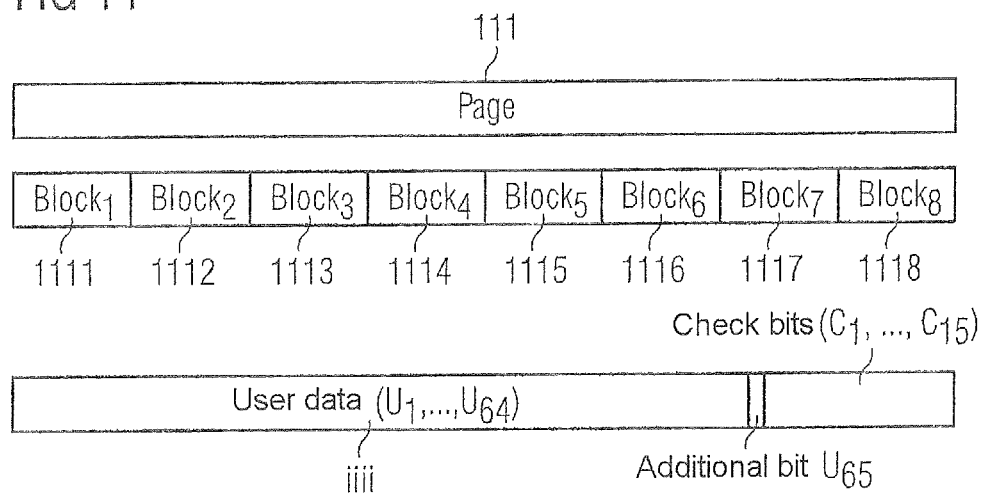
FIG. 11 shows a page of a flash memory with 8 blocks.
Figure 12:
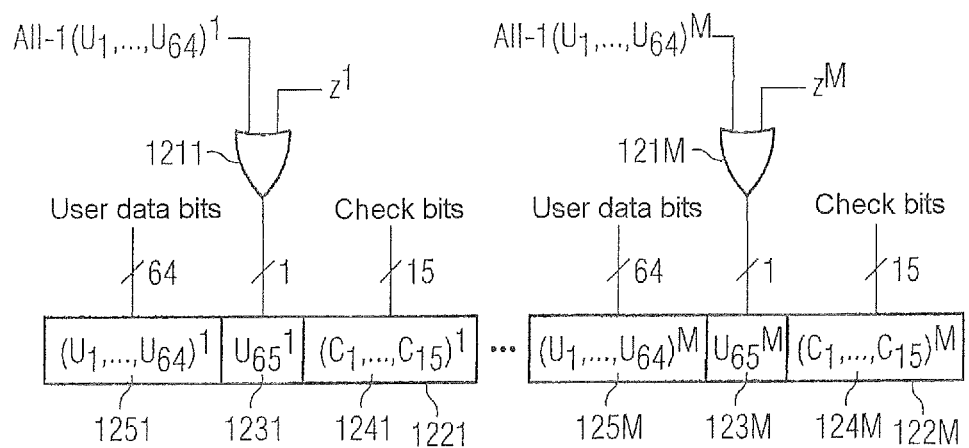
FIG. 12 shows the storage of supplementary information in a page of a flash memory.

FIG. 11 shows a page 111 of a flash memory which comprises 8 blocks Block$_1$ 1111, Block$_2$ 1112, Block$_3$ 1113, Block$_4$ 1114, Block$_5$ 1115, Block$_6$ 1116, Block$_7$ 1117, Block$_8$ 1118. For i=1, ..., 8, each block Block$_i$ 111$i$ comprises 64 user data bits $(u_1, \ldots, u_{64})^i$, an additional bit $u_{65}{}^i$ and comprises 15 check bits $(c_1, \ldots, c_{15})^i$. For a page comprising M blocks 1221, ..., 122M for a specific refinement of the invention, FIG. 12 illustrates the storage of supplementary information $z^1, \ldots, z^M$ in the additional 65th bits 1231, ..., 123M of the M blocks 1221, ..., 122M. For i=1, ..., M, each block 122$i$ respectively comprises 64 user data bits $(u_1, \ldots, u_{64})^i$, an additional bit $u_{65}{}^i$ and 15 check bits $(c_1, \ldots, c_{15})^i$. The M binary values $z^1, \ldots, z^M$ are stored in the additional bits $u_{65}{}^1, \ldots, u_{65}{}^M$ of the page under consideration.

For i=1, ..., M, the value All-1 $(u_1, \ldots, u_{64})^i$ is applied to the first input of an OR gate 121$i$, the second input of which carries the binary signal $z^i$ which is additionally to be stored in the bit $u_{65}{}^i$. In this case the value $z^i$ is stored in the bit $u_{65}{}^i$ for All-1$(u_1, \ldots, u_{64})^i \neq 1$, and the value 1 is stored for All-1 $(u_1, \ldots, u_{64})^i = 1$. By way of example, the values $z^1, \ldots, z^M$ may be the bits of the word line address of a page, components of a counter which counts the number of write and/or erase cycles in the flash memory, for example, the state of an odometer in a vehicle, control or status register contents, voltage settings which are valid for programming, control settings and other values.

The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

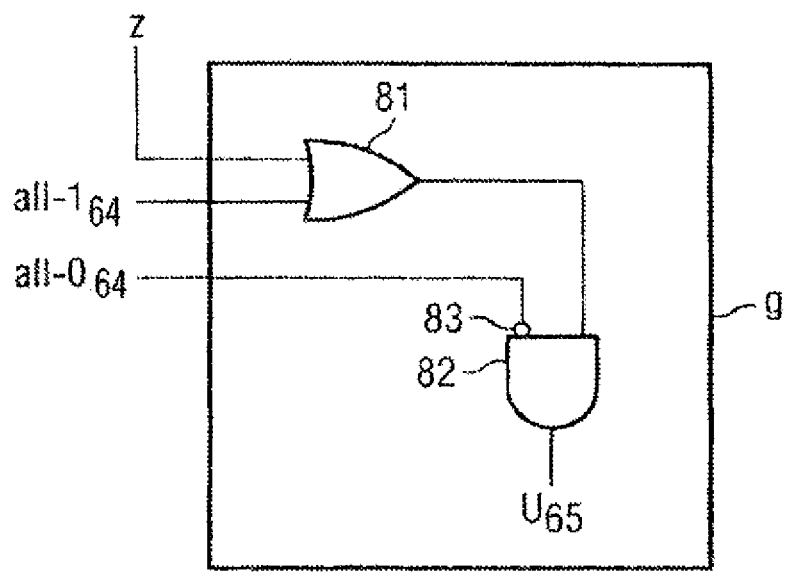

The invention claimed is:

1. A method for processing user data containing useful words, wherein the method comprises employing a coding device to produce code words based on the user data in accordance with an error recognition code, a memory to store the produced code words and a decoding device to produce user data based on the code words, comprising:

producing the code words using the coding device based on the user data; and generating the user data and supplementary data by decoding the code words using the decoding device.

2. The method according to claim 1, further comprising:

recognizing an occurrence of a special value for a code word via the decoding device; and outputting a signal that indicates that the code word and/or a user data item produced based on the code word is/are invalid.

3. The method according to claim 2, further comprising calling an invalidation command in order to change a code word stored in the memory such that it assumes a special value.

4. The method according to claim 2, wherein the special value is a value for which all bits of the code word are equal to one.

5. The method according to claim 1, wherein the error recognition code is configured to correct at least two bits within a useful word.

6. The method according to claim 1, wherein the supplementary data are produced by means of a combinatorial function based on the user data.

7. The method according to claim 6, wherein the supplementary data are produced by means of a combinatorial function based on the user data and based on the supplementary data.

8. The method according to claim 7, wherein the supplementary data are produced such that if the user data have particular values then the supplementary data take predetermined values, and otherwise the supplementary data assume the value of the supplementary user data.

9. The method according to claim 6, wherein the supplementary data are produced such that all the bits of the supplementary data are equal to one when all the bits of the user data are equal to one.

10. An apparatus for processing user data containing useful words, comprising:

a coding device configured to produce code words based on the user data in accordance with an error recognition code;

a memory configured to store the code words; and a decoding device configured to produce user data based on the code words, wherein the coding device is configured to produce the code words based on the user data and based on supplementary data, and wherein the decoding device is configured to produce the user data and the supplementary data based on the code words.

11. The apparatus according to claim 10, wherein the memory comprises a non-volatile memory.

12. The apparatus according to claim 10, wherein the apparatus comprises a microcontroller.

13. The apparatus according to claim 10, wherein the apparatus further comprises a program-controlled device configured to process the user data with a processing bit length that is equal to the bit length of the user data.

14. A method for coding user data containing user data bits $(u_1, u_2, \ldots, u_K)$ using an error recognition code, in a memory device, wherein the method comprises:

producing code words $(v_1, \ldots, v_{K+m+1})$ based on the user data $(u_1, u_2, \ldots, u_K)$ and at least one supplementary bit, and wherein the at least one supplementary bit is produced by means of a combinatorial function based on the user data and a supplementary information item; and storing the produced code words in the memory device.

15. The method according to claim 14, wherein if the user data take on at least one particular value then the at least one supplementary bit is provided with a value which is respectively associated with the respective particular value for the user data, and if the user data do not take on the particular value then the at least one supplementary bit is produced exclusively based on the supplementary information item.

16. The method according to claim 15, wherein the supplementary information item is used for storing system information.

17. An apparatus for coding user data using an error recognition code, comprising:

a coding device configured to produce code words; and a combinatoric device configured to produce at least one supplementary bit, wherein the coding device is configured to produce the code words based on the user data and the at least one supplementary bit and wherein the combinatoric device is configured to produce the at least one supplementary bit based on the user data and a supplementary information item.

* * * * *

UNITED STATES PATENT AND TRADEMARK OFFICE
CERTIFICATE OF CORRECTION

Page 1 of 2

PATENT NO. : 8,533,566 B2
APPLICATION NO. : 13/020318
DATED : September 10, 2013
INVENTOR(S) : Ulrich Backhausen et al.

It is certified that error appears in the above-identified patent and that said Letters Patent is hereby corrected as shown below:

IN THE DRAWINGS:

Please delete Figures 4 & 8 and replace with attached Figures 4 & 8.

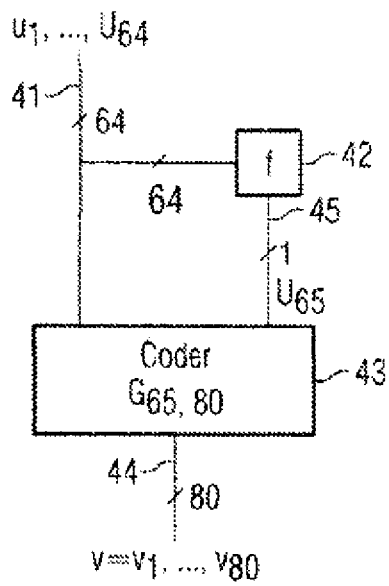

Signed and Sealed this
Third Day of December, 2013

Margaret A. Focarino
*Commissioner for Patents of the United States Patent and Trademark Office*